(12) United States Patent
Costantini et al.

(10) Patent No.: US 6,491,971 B2
(45) Date of Patent: Dec. 10, 2002

(54) RELEASE COATING SYSTEM FOR CRUCIBLES

(75) Inventors: Michael A Costantini, Hudson, NH (US); Mohan Chandra, Merrimack, NH (US); Keith Matthei, Nashua, NH (US); Alleppey V. Hariharan, Nashua, NH (US)

(73) Assignee: G.T. Equipment Technologies, Inc, Nashua, NH (US)

( * ) Notice: Subject to any disclaimer, the term of this patent is extended or adjusted under 35 U.S.C. 154(b) by 0 days.

(21) Appl. No.: 09/827,540

(22) Filed: Apr. 6, 2001

(65) Prior Publication Data

US 2002/0146510 A1 Oct. 10, 2002

Related U.S. Application Data

(60) Provisional application No. 60/248,880, filed on Nov. 15, 2000, and provisional application No. 60/249,023, filed on Nov. 15, 2000.

(51) Int. Cl.[7] .............................. B05D 3/02; B05D 5/08
(52) U.S. Cl. ..................... 427/133; 427/226; 427/236; 427/387; 427/393.6; 427/397.7; 427/427; 106/38.22; 106/287.11; 106/287.13
(58) Field of Search ................................. 427/226, 236, 427/133, 233, 385.5, 387, 397.7, 425, 427, 393.6; 106/38.22, 287.11, 287.13

(56) References Cited

U.S. PATENT DOCUMENTS

| | | | |
|---|---|---|---|
| 3,613,633 A | | 10/1971 | Anderson |
| 3,660,075 A | | 5/1972 | Harbur et al. |
| 3,746,569 A | | 7/1973 | Pammer |
| 4,218,418 A | | 8/1980 | Schmid et al. |
| 4,256,530 A | | 3/1981 | Schmid et al. |
| 4,548,381 A | * | 10/1985 | Mabie et al. ................. 156/82 |
| 4,741,925 A | | 5/1988 | Chaudhuri et al. |
| 5,275,655 A | * | 1/1994 | Grunau et al. ............. 106/38.2 |
| 5,380,482 A | * | 1/1995 | Maginnis et al. ............. 419/33 |
| 5,384,291 A | | 1/1995 | Weimer et al. |
| 5,431,869 A | | 7/1995 | Kumar et al. |
| 5,540,884 A | | 7/1996 | Chiao |
| 5,830,269 A | * | 11/1998 | Kawase et al. ................ 117/81 |
| 5,980,629 A | * | 11/1999 | Hansen et al. ................ 117/13 |
| 6,165,425 A | * | 12/2000 | Lange et al. ................. 422/243 |
| 6,334,603 B1 | * | 1/2002 | Wakita et al. ........... 106/38.27 |

OTHER PUBLICATIONS

Takeshi Saito, Akio Shimura and Shoji Ichikawa, A New Directional Solidification Technique for Polycrystalline Solar Grade Silicon, IEEE, 1981, p. 576–580.

C. Habler, J. Liebermann, S. Thurm, W. Koch, D. Karg, G. Pensl and R. Knobel, Lifetime Improvement of Multicrystalline Silicon: Identification and Dissociation of Thermal Oxygen Donors, 14th European Photovoltaic Solar Energy Conference, Barcelona Spain, Jun. 30–Jul. 4, 1997, p. 720–723.

E. Borne, G. Goaer, D. Sarti, A. Laugier, 3D Distribution Study of Impurities into a Polix Ingot, 13th European Photovoltaic Solar Energy Conference, Nice, 1995, p. 1340–1343.

(List continued on next page.)

Primary Examiner—Bret Chen
Assistant Examiner—Kirsten A. Crockford
(74) Attorney, Agent, or Firm—Vernon C Maine; Maine & Asmus

(57) ABSTRACT

A method for preparing a release coating and applying it to crucibles used to contain molten material while it solidifies, by mixing a release coating power with a dry organic binder into a powder and binder dry mixture, mixing a defoamer with a liquid into a liquid and defoamer mixture, mixing the dry mixture with the liquid and defoamer mixture into a wet release coating, sieving to remove lumps and particles, checking the viscosity, wet-spraying onto a crucible, evaporating the liquid from the wet release coating so as to leave a dry release coating on the crucible, and separating the binder from the dry release coating by thermal decomposition.

11 Claims, 2 Drawing Sheets

OTHER PUBLICATIONS

M. Acciarri, S. Binetti, S. Ratti, C. Savigni, S. Pizzini, Study and Conditioning of Defected Areas in Eurosil Muliticrystalline Silicon, 13th European Photovoltaic Solar Energy Conference, Nice, 1995, p. 1336–1339.

G. Revel, J.L. Pastol, D. Hania, H. Nguyen Dinh, Selection of a Crucible Material in Contact with Molten Silicon, Fifth E.C. Photovoltaic Solar Energy Conference, Athens, Greece, 1983, p. 1037–1043, D. Reidel Publishing Company.

S. Ashok, J. Chevallier, I. Akasaki, N.M. Johnson, B.L. Sopori, Defect and Impurity Engineered Semiconductors and Devices, Materials Research Society Symposium Proceedings vol. 378, San Francisco, California, 1995, pp. 767–776.

Takeshi Saito, Akio Shimura, Shoji Ichikawa, A Reusable Mold in Directional Solidification for Silicon Solar Cells, Solar Cells, Solar Energy Materials 9, 1983, pp. 337–345, North–Holland.

C. P. Khattak, F. Schmid, Growth of 240 KG Multicrystalline HEM™ Silicon Ingots, Reprint of paper presented at the 2nd World Conference and Exhibit on Photovoltaic Solar Energy Conversion, Vienna, Austria, 1998 no page numbers.

C. P. Khattak, F. Schmid, W. K. Schubert, High–Efficiency Solar Cells Using Hem Silicon, IEEE First WCPEC, Hawaii, 1994, p. 1351–1355.

C. P. Khattak, F. Schmid, W. K. Schubert, M. Cudzinovic, B. L. Sopori, Characteristics of HEM Silicon Produced in a Reusable Crucible, 23rd IEEE PVSC Conference, Louisville, Kentucky, 1993, p. 73–77.

C. P. Khattak, F. Schmid, Growth and Characterization of 200 KG Multicrystalline Silicon Ingots by HEM, Reprint of paper presented at the 26th IEEE PVSC Conference, Anaheim, CA, 1997 no page numbers.

C. P. Khattak, F. Schmid, HEM Technology for Photovoltaic Applications, Proceedings of 6th International Photovoltaic Science and Engineering Conference, New Delhi, India, 1992, p. 117–124.

P.S. Ravishankar, Liquid Encapsulated Bridgman (LEB) Method for Directional Solidification of Silicon Using Calcium Chloride, Journal of Crystal Growth 94, 1989, p. 62–68, Elsevier Science Publishers B.V., North–Holland.

PCT International Search Report dated Jul. 26, 2001 of International Application No. PCT/US01/11830 filed Apr. 11, 2001.

* cited by examiner

RELEASE COATING SYSTEM FOR CRUCIBLES

This application relates and claims priority for all purposes to pending U.S. application Ser. No. 60/248,880 filed on Nov. 15, 2000 and Ser. No. 60/249,023 filed on Nov. 15, 2000.

FIELD OF INVENTION

The invention relates to preparation and application of release coatings for crucibles used in the handling of molten materials that are solidified in the crucible and then removed as ingots, and more particularly to release coatings for crucibles used in the directional solidification of polycrystalline silicon.

BACKGROUND

Crucibles of fused-silica (quartz) are typically used in directional solidification of polycrystalline silicon. Quartz is chosen primarily for high-purity and availability. There are problems in using quartz, however, as a crucible for the production of silicon by this method.

Silicon in its molten state will react with the quartz crucible that is in contact with it. Molten silicon reacts with quartz to form silicon monoxide and oxygen. Oxygen will contaminate the silicon. Silicon monoxide is volatile, and will react with the graphite components inside the furnace. Silicon monoxide reacts with graphite to form silicon carbide and carbon monoxide. The carbon monoxide will then react with the molten silicon, forming additional volatile silicon monoxide and carbon. Carbon will contaminate the silicon.

The reaction between quartz and silicon promotes adhesion of the silicon to the crucible. This adhesion, combined with a difference in coefficients of thermal expansion between the two materials, creates stress in the silicon ingot, causing it to crack on cooling. It is known in the art that a release coating applied to the inside of the crucible in the area of contact with the ingot can prevent the reaction between silicon and quartz that leads to ingot contamination and cracking. To be effective, the release coating must prevent the silicon from reacting with the quartz crucible, and must not adversely contaminate the silicon either by itself or from contaminants within it.

A variety of materials and techniques are described in the literature, which attempt to solve the problem of reaction and adhesion of the crucible in contact with molten material. For example, U.S. Pat. No. 4,256,530 by Schmid et al., suggests coating the outside of a quartz crucible with a refractory material, to prevent reaction with adjacent carbon components. The coating does not contact the molten silicon. The method of preparing and applying the coating are, however, undisclosed.

U.S. Pat. No. 5,431,869 by Kumar, et. al., describes a multi-component release agent of silicon nitride and calcium chloride for silicon processing using a graphite crucible. The silicon nitride coating is applied as a slurry in an organic binder and solvent. The method of preparation and application are largely undisclosed. It is suggested that the binder can be removed after the coating, but the details are undisclosed. The calcium chloride portion is introduced with the bulk silicon, rather than as a coating, to the silicon-nitride coated crucible. The use of silicon nitride alone is described as unfavorable as a crucible coating for directional solidification of silicon.

U.S. Pat. No. 4,741,925 by Chaudhuri, et. al., describes a silicon nitride coating for crucibles applied by chemical vapor deposition at 1250 degrees Centigrade. U.S. Pat. No. 3,746,569 discloses the pyrolysis formation of a silicon nitride coating on the walls of a quartz tube. The process requires application temperatures at least 800 degrees C, and tempering at 1250 degrees Centigrade. U.S. Pat. No. 4,218,428 by Schmid, et. al., describes a technique of forming a glass layer inside a silica crucible by rapid heating to prevent cracking of silicon during melt-processing.

U.S. Pat. No. 3,660,075 by Harbur et al., discloses a coating of niobium carbide or yttrium oxide on a graphite crucible for melting fissile materials. The niobium carbide is applied by chemical vapor deposition, while the yttrium oxide is applied as a colloidal suspension in an aqueous inorganic solution. Details such as the method of preparation and application are largely undisclosed. U.S. Pat. No. 3,613,633 by Anderson, describes a heated rotating crucible used to hold articles to be coated. The crucible facilitates the containment of an "evaporant" which coats the articles therein. The crucible itself is not, however, used to contain molten material.

Reference is made in "Liquid Encapsulated Bridgman (LEB) Method for Directional Solidification of Silicon Using Calcium Chloride", by P. S. Ravishankar, Journal of Crystal Growth, 94 (1989) 62–68, to the coating of a silica crucible with silicon nitride. However, no method is detailed for preparing and applying the coating. Furthermore, the resulting ingot quality using this coating is described as poor, due to particle nucleation leading to poor grain-growth and low solar cell efficiency.

Saito, et. al., in "A Reusable Mold in Directional Solidification for Silicon Solar Cells", Solar Energy Materials, vol 9, (1983) pg 337–345, and in "A New Directional Solidification Technique for Polycrystalline Solar Grade Silicon", Conf. Record of 15 th PV Specialists Conference, 1981, p 576–580, describes a coating of silicon nitride powder which is brushed onto a quartz, silicon carbide coated carbon or silicon nitride sintered mold. The powder is suspended in an organic solvent, which is evaporated by heating. Methods of preparation and application are not detailed, except that the coating needs to be at least 150 microns thick.

Saito reports, "The [silicon nitride] powder was mixed together with a suitable amount of organic solvent, such as liquid polyvinylalcohol, to form a slurry. The slurry was coated by a brush on the inner crucible walls. Then, the crucible was heated in an air ambient at 600 C. for 30 minutes to burn out the organic solvent. The coated layer thus obtained had good mechanical strength against scratching." However, no method is detailed for preparing and applying the coating. Brushing, we have found, is a difficult way to obtain a uniform coating.

Scaling a laboratory process such as Saito's up to production requirements is also problematic. Saito's crucible was only a few inches across, and contained only 225 g of molten material, while the present technology requires crucibles over two feet across, and contains over 240 kg of molten material. The difference in size and weight makes the physical demands on the coating and the coating process much more profound.

Other publications that mention crucible coatings, usually of silicon nitride, for directional solidification of silicon, but do not discuss methods of preparation or details of application, include: "HEM Technology for Photovoltaic Applications", Khattak et al, 6th IPSEC Conference, New Delhi, India, 1992, p 117–124; "Growth and Characterization of 200 kg Multicrystalline Silicon Ingots by HEM", 26th IEEE PVSC Conference, Anaheim, Calif., Sep. 29–30

1997; "Growth of 240 kg Multicrystalline HEM Silicon Ingots", 2nd WCPEC Conference, Vienna, Austria, Jul. 6–10 1998; "High Efficiency Solar Cells Using HEM Silicon", First WCPEC Conference, Dec. 5–9, Hawaii, 1994 p 1351–1355; "Characteristics of HEM Silicon in a Reusable Crucible", 23rd IEEE PV Specialists Conference, Louisville, Ky., May 10–14, 1993, p 73–77; "Analysis and Control of the Performance-Limiting Defects in HEM-Grown Silicon for Solar Cells", Material Research Society Symposium Proceedings, 1995, v 378 p 767–776; "Lifetime Improvement of Multicrystalline Silicon", Habler et al., 14 th EPVSE Conference, Barcelona, Spain, Jun. 30–Jul. 4, 1997, p 720–723; "3D Distribution Study of Impurities into a Polix Ingot", Borne et al., 13th European PV Conference, Nice, France, 1995, p 1340–1343; "Study and Conditioning of Defect Areas in Eurosil Multicrystalline Silicon", Acciarri et al., 13th European PV Conference, Nice, France, 1995, p 1336–1339; and "Selection of a Crucible Material in Contact with Molten Silicon", Revel et al., 5th EC PV SEC, Athens, Greece, Oct. 17–21 1983, p 1037–1042.

Prior art references include specific references to powdered mold release agents for application to crucibles in the directional solidification of silicon. In addition, the use of chemical vapor deposition, solvent evaporation, high-temperature flame treatment, and other expensive and complex means are mentioned for application of crucible coatings. References are made to specific binders and solvents. Although there is a tremendous emphasis in the literature on controlling the purity of the molten material, such emphasis is lacking in the prior art references as to the powder coating process. Silicon Nitride, for example, is available in a variety of phases, purity, and particle size, which may or may not make them suitable for coating.

References are made to mixing, spraying, or brushing for slurries of powdered coatings. There is no mention, however, of a method to mix, spray, or brush the coating in such a way as to control physical properties such as viscosity, foam content, dispersion quality, in order to provide a uniform coating on the crucible and to avoid contaminating the coating in the process of carrying out these steps.

We have discovered, for example, that the use of a specific silicon nitride powder, Baysinid(R), disclosed by Habler et al., in "Lifetime Improvement of Multicrystalline Silicon", 14th EPVSE Conference, Barcelona, Spain, Jun. 30–Jul. 4, 1997, p 720–723, in preparing crucible coatings, is heavily aggregated and difficult to disperse, created a poor suspension which was unstable, and caused spraying equipment to clog. This resulted in an extended time required for coating application, and a non-uniform coating which is not reliable in preventing adhesion of molten silicon to the crucible. Ingots were sometimes cracked during operations in which this material was used, due to difficulties related to poor dispersion and clogging. Milling operations using conventional means to properly grind the aggregates to form a stable suspension would contaminate the coating with metal or metal oxide that would contaminate molten silicon.

These examples illustrate how the reviewer of the prior art is led to believe that the selection of specific components and details of their preparation are obvious. We have found, however, that the selection of powders, binders, solvents, and their preparation for applying as a reliable and high-quality coating to a crucible is not in fact obvious, but requires substantial inventiveness to accomplish.

SUMMARY OF THE INVENTION

It is an object of this invention to provide a simple, inexpensive coating system and application process for coating crucibles with a release coating for use in a production environment for the manufacture of ingots of polysilicon or other materials. The system will preferably include a coating material having suitable crucible adhesion and ingot release characteristics when applied to a crucible as a release layer for the molten material, and for which there is a powered form of the material available with a suitable particle size and dispersibility for spray application using commercial equipment and conventional methods.

There will be a safe and inexpensive liquid solvent for the coating material, preferably water, in which to suspend the powder, and an organic binder possessing physical and chemical characteristics that facilitate the application of the coating system to crucibles using commercially available spraying equipment. The coating may include additives to improve its quality, make it more sprayable, easier to apply uniformly, and improve its mixing characteristics and control its physical properties. The powder, binder, and solvent are selected and processed such that the resulting final release coating on the crucible does not adversely contaminate the molten material.

It is a further object of the invention to provide a means to remove the solvent from the coating and harden the binder to prevent movement of the coating during subsequent processing, such as by preheating or holding the crucible at a slightly elevated temperature so as to facilitate the evaporation of the solvent and drying of the coating on the crucible after the spraying operation.

It is another object to provide a means to remove the binder by thermal decomposition from the coating and to densify the final coating so as to minimize damage to the coating during subsequent processing of the molten materials, such as by bisque-firing firing the crucible by slowly heating the crucible in oxidizing air to well above a temperature at which the binder material will be readily oxidized dispersed into the air, maintaining the crucible at or near that temperature for a period of time to assure hardening of the remaining layer, and allowing it to cool slowly to room temperature.

Still other objects and advantages of the present invention will become readily apparent to those skilled in this art from the following detailed description, wherein we have shown and described only a preferred embodiment of the invention, simply by way of illustration of the best mode contemplated by we on carrying out our invention.

DESCRIPTION OF THE PREFERRED EMBODIMENT

The material to be applied as a crucible release coating is provided in powder form and is readily dispersible in water by high-speed mixing. Readily dispersible refers to a suspension, once prepared at the correct viscosity, which can be applied as a uniform coating by commercially-available spray-painting equipment without clogging, and from which particles will not segregate by settling during the time period required for application to the crucible. Such a suspension will exhibit no scratches when tested using a 50 micron Hegman Gauge. High-speed mixing refers to using a shaft mixer with a non-metal or non-metal coated dispersion blade of the "cowles"design or equivalent, such as Norstone(tm). The peripheral speed of the mixing blade is maintained at or above 3000 revolutions per minute, such that the vortex formed by the liquid exposes not less than two thirds (2/3) of the diameter of the mixing blade.

Figure 1:
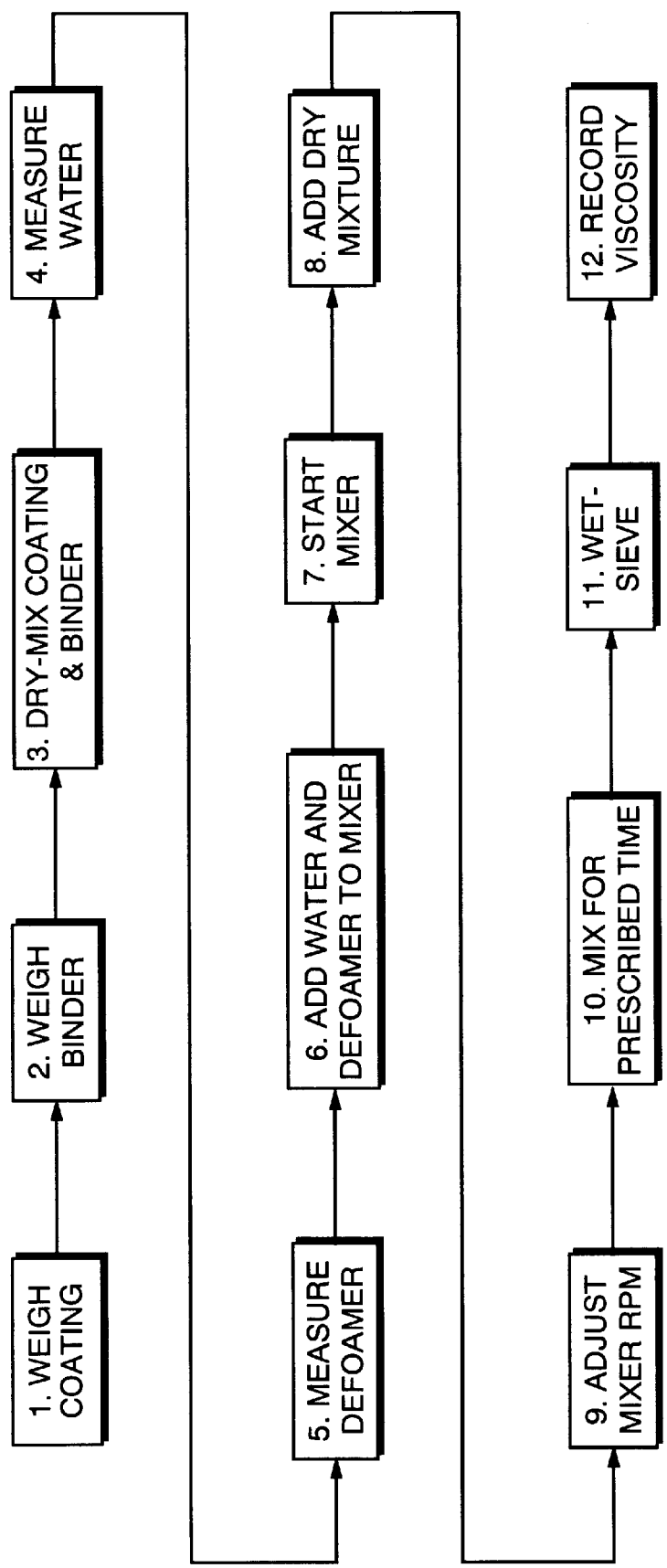
FIG. 1 is a flowchart of the steps of the preferred embodiment method of the invention as described below.

Referring to FIG. 1, a logic flowchart depicting the steps of the process to prepare the coating, the coating powder is weighed (1) and combined with an appropriate weight (2) of dry water-soluble polymer binder material such as cellulose ether. The ratio of coating powder to binder is at least 5:1 weight basis. The coating powder and binder are mixed together (3) into a dry mixture until the binder is indistinguishable from the coating powder by visual inspection.

Deionized water having an electrical resistivity greater than 10,000 ohm-cm is measured (4) and poured into a clean plastic or plastic-lined vessel having a volume sufficient to contain the wet coating during preparation. Added to the water is a defoamer (5), such as Polyglycol P1200 polypropylene glycol or equivalent, in the amount of 500–1000 ppm for the volume of water used. Absence of defoamer in the process results in large amounts of foam produced, which will reduce dispersion efficiency, markedly increase the volume and viscosity of the suspension, and reduce the smoothness of the sprayed coating on the crucible.

The water and defoamer mixture are added to the mixer (6) and agitated (7) as described above. While mixing, the dry mixture is added slowly (8) to the water, forming a wet coating. The mixer speed is adjusted (9) during dry mixture addition to maintain the vortex of the liquid. Mixing is continued (10) after dry mixture addition is completed, for a prescribed period of time necessary for the wet coating viscosity to equilibrate. After mixing is completed, the wet coating is sieved (11) through a fine-mesh bag, into a clean, dry beaker and its viscosity is recorded (12).

After mixing, the wet coating is transferred to a commercially available spray gun such as Binks 95G. The crucible to be coated for release is prepared for coating by heating to a temperature above 110 F. and less than 150 F. by heating in an oven, or by heat-lamps or heat-guns, or by direct contact heating with heat blankets, or other convenient 201 means, thereby facilitating rapid drying of the coating. The wet coating is sprayed evenly onto the surface of the crucible at a rate sufficient to prevent running, or cracking upon drying. Once coated, the wet coating is permitted to dry to form a dry release coating. If a thicker coating is required the crucible is reheated as before and the coating is applied again and permitted to dry.

The dry release coating is then transferred to a kiln which will heat the crucible to a temperature necessary to remove the binder by thermal decomposition in oxidizing air, and to partially densify the coating to a "bisque-fired" condition. An oxidizing atmosphere is required, otherwise the organic material will decompose to carbon, which may cause contamination of the molten material during directional solidification. The crucible is then cooled to a temperature where it can be handled by an operator. The finished crucible is then removed. The strength of the coating is sufficient after firing to maintain coating integrity during loading and manipulation of the crucible into the furnace.

Figure 2:
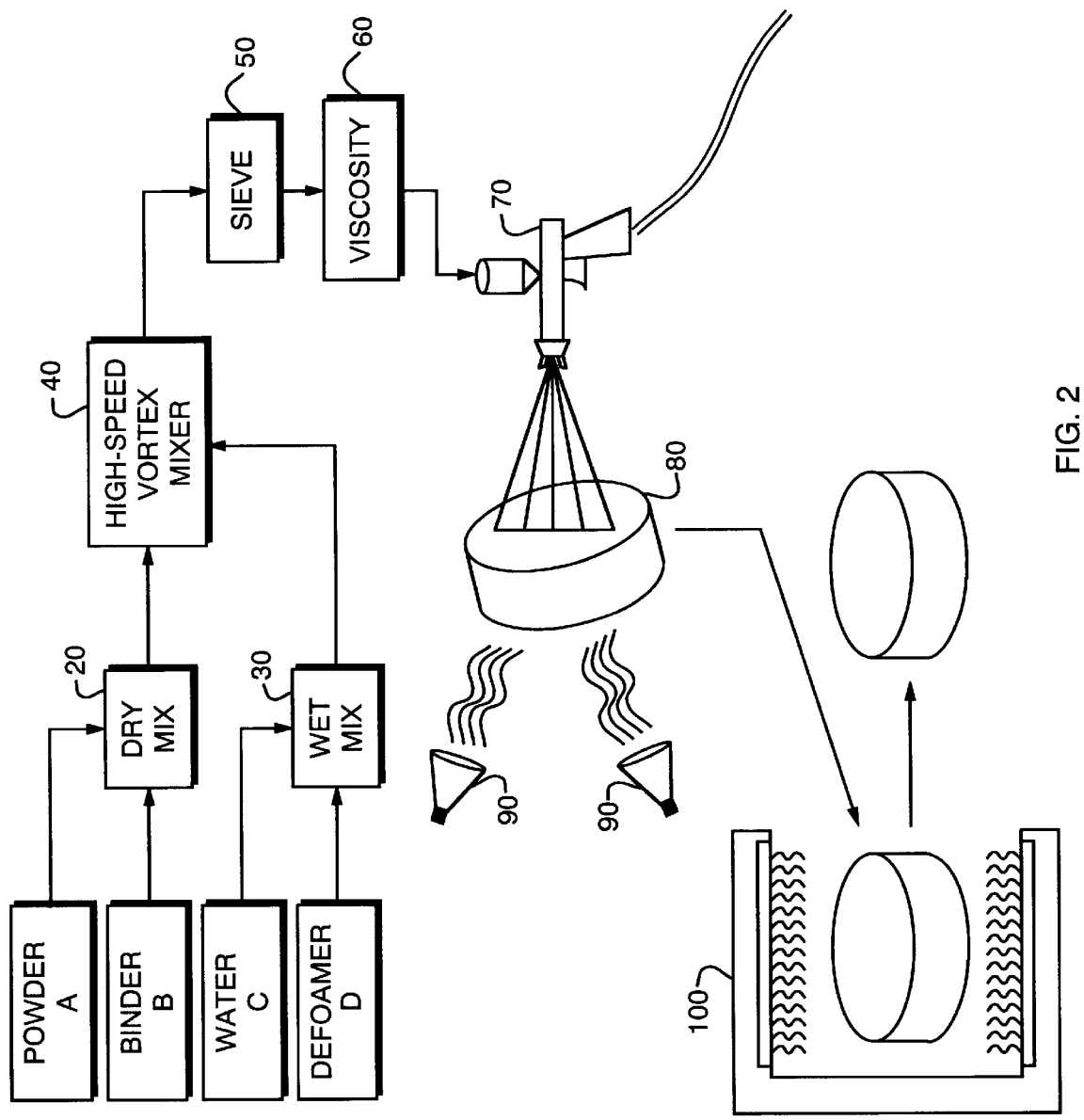
FIG. 2 is a simplified block diagram of the materials flow of the flowchart of FIG. 1.

Referring to FIG. 2, a diagrammatic illustration of the materials path of the process correlating to the FIG. 1 steps of the process, coating power A and binder B are weighed and dry mixed together in container 20 at a minimum ratio of 5:1, dry mixture AB being mixed until binder B is indistinguishable from power A. Separately, in container 30, to the selected volume of deionized water C there is added the 500–1000 parts per million volume of defoamer D, the result being water/defoamer mixture CD. Then water/defoamer mixture CD is added to the high speed mixer 40 first, and the vortex agitation begun. Dry mixture AB is slowly added to mixer 40, with appropriate adjustments to mixer power and speed to maintain the vortex, thus forming the wet release coating ABCD.

Wet release coating ABCD is then passed through sieve 50, a fine mesh paint bag, and into beaker 60, where viscosity is checked. From there, the coating is transferred to spray gun 70, for conventional spray application to at least the interior of crucible 80, which is being maintained at a slightly elevated temperature by heat lamps 90. The wet release coating on the warm crucible dries quickly, evaporating the water component and leaving a dry release coating consisting substantially of power A and binder B.

Crucible 80 with its dry release coating AB is then transferred to kiln 100, where the crucible is heated to a temperature necessary to remove binder B by thermal decomposition, leaving a final release coating A, and to partially densify the remaining release coating to a "bisque-fired" condition. Crucible 80 is then cooled and removed for use in the production of polysilicon.

As an example of the preferred method, 390 grams of silicon nitride powder (H. C. Stark, Newton, Mass.), having a volume average particle size of 0.7 microns, with 90 vol % less than 1.2 microns, and 10 vol % less than 0.5 microns, is thoroughly mixed in dry form with 72 grams of cellulose ether (Dow Chemical, Midland, Mich.) binder to form a dry mixture in a glass container using a Teflon rod. The silicon nitride powder has a level of iron less than 7 ppm, and copper 0.5 ppm. The binder has a viscosity in water of 15 centipoises at a concentration of 2 wt %. The binder has iron at 20 ppm and copper 0.5 ppm. Into another glass container of 2 liters capacity, 1500 ml of deionized water is mixed with 1 ml of polyglycol P1200(Dow Chemical, Midland, Mich.) defoamer. The water and defoamer are mixed using a high-shear mixer. The mixer is fitted with a 3 " diameter polyurethane impeller (Norstone, Inc.), and is operating at a speed capable of generating a vortex that covers only 1/3 the diameter of the impeller.

The dry mixture is added to the water mixture in 50 ml increments over a period of 10 minutes, to form a wet coating. The water is deionized and has a resistivity of greater than 17 megaohm-cm. During the addition, the speed of the mixer is adjusted to maintain the vortex, with 1/3 diameter or less impeller coverage. Once the dry mixture is added, the wet coating is mixed for 10 minutes to completely dissolve the binder. After mixing, the wet coating is removed from the mixer and poured slowly through a standard fine-mesh paint bag into a 2 liter glass beaker and allowed to de-air for 15 minutes. The paint bag trapped no lumps or grit particles.

The condition of the coating is a smooth suspension with no lumps or grit detectable when rubbed through the fingers. A sample is withdrawn to a standard Hegman gauge which confirms dispersion quality by displaying no scratches down to zero reading. The viscosity is tested using a Zahn #2 cup with a result of 60 seconds. The wet coating is sprayed using a spray gun (Binks, Inc. 95-G) onto a silica crucible heated to 120–150 Degrees F. using a heat-lamp, and dried in air at 120–150 degrees F.

During the spray process the coating is sprayed slowly and evenly to avoid runs or drips, in thin coats which are allowed to dry before reapplying. The dried coating is smooth with no cracks. The total application and drying time are 90 minutes. The coating is measured using a Durometer which reads 89 Shore A. The coated crucible is heated in air to 1095 degrees C. over a period of 12 hours, maintained at 1095 degrees C. for 3 hours, and allowed to cool slowly to room temperature. The coating is then measured with a durometer which shows it has been hardened to 95 Shore A.

The invention is susceptible of many variations, all within the scope of the claims that follow. For example, there is a method for preparing a wet release coating for spray application to crucibles used to contain molten material in a HEM furnace while it solidifies into an ingot. The crucible may be a fused-silica crucible, although other materials are and can be used for such crucibles. The molten material may be silicon or such other material as needs to be processed from a molten state to a hardened state within a crucible, cooled, and then removed. The wet release coating will need to be applied to the crucible by some suitable fashion, and may require further treatment or processing to reach a final state of readiness for use with the molten material.

There is first weighed a unit portion of a release coating power, that is to say a powered form of the material that will be the finish coating on the crucible. Then there is measured out a corresponding portion of a dry organic binder, compatible with the coating material, of not more than one fifth by weight of the unit portion of release coating power. The binder is mixed with the coating power into a dry mixture.

There is measured out a unit volume of liquid solvent sufficient for the process. There is then measured out a corresponding unit volume of a defoamer compound of between about 500 to 1000 parts per million by volume of the unit volume of liquid. The defoamer is then mixed with the liquid into a liquid and defoamer solvent mixture. The dry mixture of power and binder are mixed with the liquid and defoamer mixture into a wet release coating, which is then sieved to remove lumps and particles. The wet coating may be checked for suitable viscosity prior to attempting its application.

The release coating may be a compound from among a group of compounds consisting of silicon nitride, silicon carbide, zirconium oxide, barium zirconate, magnesium zirconate, or a combination thereof. The organic binder may be cellulose ether. The cellulose ether may have a viscosity of not less than 15 centipoises at 20 degrees C., at a concentration in water of two percent. The ratio of the coating powder to the organic binder may be at least 5:1 by weight.

The liquid may be deionized water with an electrical resistivity of at least 10,000 megaohms-cms. The defoamer may consist of one of a group of defoamers that includes polypropylene glycol and polyethylene glycol.

As another example, there is a method for applying a release coating, such as the wet release coating above, to crucibles used to contain molten material while it solidifies into an ingot, consisting of the further steps of wet-spraying the release mixture onto a crucible, evaporating the liquid from the wet release coating so as to leave a dry release coating on the crucible, which may be done by heating the crucible in any convenient way so as to hasten the evaporation process, and then separating the binder from the initial dry release coating by thermal decomposition so as to leave a hardened finish release coating. As above, the crucible may be a fused-silica crucible, although other materials are and may be used for such crucibles. The molten material may be silicon or such other material as need be processed from a molten state to a hardened state within a crucible, cooled, and then removed.

As yet another example of the invention, there is a method for applying a release coating to crucibles used to contain molten material, consisting of the steps of mixing a release coating power with a dry organic binder into a powder and binder dry mixture, mixing a defoamer with a liquid solvent into a solvent mixture, mixing the dry mixture with the solvent mixture into a wet release coating, sieving the wet release mixture so as to remove lumps and particles to the degree required for the intended spraying equipment and technique, wet-spraying the release mixture onto a crucible, evaporating the solvent mixture from the wet release coating so as to leave a dry release coating on the crucible, and then decomposing the binder from the dry release coating and hardening the finish release coating.

The decomposing of the binder is preferably done by thermal means such as slowly raising the temperature of the sprayed crucible in air to or above the decomposition temperature of the binder, so that the binder components are oxidized and dissipated in the air.

The crucible may be a fused-silica quartz crucible. The molten material may be silicon. The organic binder may be cellulose ether. The cellulose ether may have a viscosity that is not less than 15 centipoises at 20 degrees C., at a concentration in water of two percent.

The release coating may be a compound from among the group of compounds consisting of silicon nitride, silicon carbide, zirconium oxide, barium zirconate, magnesium zirconate or combinations of these. The wet release coating may have a ratio by weight of powder to organic binder of at least 5:1. The liquid solvent may be deionized water with an electrical resistivity of at least 10,000 megaohms-cms. The dry release coating having a particle size 90% by volume less than 2 microns in diameter.

The defoamer may be one of a group of defoamers consisting of polypropylene glycol and polyethylene glycol. The wet release coating may have a viscosity as measured by Zahn#2 cup of between 15 and 120 seconds, preferably between 50 and 80 seconds. The step of decomposing may consist of slowly heating the crucible to at least the thermal decomposition temperature of the binder.

There may be, prior to the step of wet-spraying, the further step of assuring the viscosity of wet release mixture is suitable for spray application. This means first, simply measuring the viscosity to assure that it is within the desired range for the intended spraying equipment and technique. If upon measuring the viscosity, it is found to be out of range, further adjustment of the ratio of dry mixture to solvent mixture is made by adding one or the other to the wet release mixture as needed, mixing or remixing as before, re-sieving the mixture, and rechecking the viscosity. This is repeated, if necessary, until the viscosity is within an acceptable range for the spraying operation.

As yet another example of the invention, there is a method for applying a release coating to crucibles used to harden molten material into ingots, consisting of the steps of weighing a unit portion of a release coating power, measuring out a corresponding portion of a dry organic binder of not more than one fifth by weight of the unit portion of release coating power, mixing the binder with the power into a dry mixture, measuring a unit volume of liquid solvent, and measuring out a corresponding unit volume of a defoamer of between about 500 to 1000 parts per million by volume of the unit volume of liquid solvent, mixing the defoamer with the liquid solvent into a solvent mixture.

Then, mixing the dry mixture with the solvent mixture into a wet release coating, sieving the wet release mixture so as to remove lumps and particles to the degree required for the intended spraying equipment and technique, assuring proper viscosity of the wet release mixture for spraying, wet-spraying the release mixture onto a said crucible, evaporating the solvent mixture from the wet release coating so as to leave a dry release coating on the crucible, and separating the binder from the dry release coating by thermal decomposition.

As still yet another example of the invention, there is a method for preparing a wet release coating for spray application to a crucible used to contain molten material while it cools into an ingot, consisting of the steps of weighing a unit portion of a release coating power, measuring out a corresponding portion of a dry organic binder of not more than one fifth by weight of the unit portion of release coating power, mixing the binder with the power into a dry mixture, measuring a unit volume of liquid solvent, measuring out a corresponding unit volume of a defoamer of between about 500 to 1000 parts per million by volume of the unit volume of liquid solvent, mixing the defoamer with the liquid solvent into a solvent mixture, mixing the dry mixture with the solvent mixture into a wet release coating, sieving the wet release mixture so as to remove lumps and particles, and assuring viscosity of wet release mixture is suitable for spray application.

As will be realized, the invention is capable of other and different embodiments, and its several details are capable of modifications in various obvious respects, all without departing from the invention.

We claim:

1. A method for applying a release coating to a fused silica crucible used to form molten silicon into a solid silicon ingot, comprising the steps:

using a release coating powder wherein 90% by volume of said powder has a particle size of less than 2 microns diameter, mixing said release coating powder with a dry cellulose ether binder into a powder aid binder dry mixture with a ratio by weight of said powder to said binder of at least 5:1, mixing a defoamer with water into a solvent mixture, mixing said dry mixture with said solvent mixture into a wet release coating, sieving said wet release coating so as to remove lumps and particles, confirming the viscosity of the wet release coating to be between 50 and 80 seconds as measured by a Zahn #2 cup, heating said crucible to be spray-coated to between 120 and 150 degrees F., spraying said wet release coating onto said crucible, slowly heating said crucible in oxidizing air to at least 1095 degrees C., and maintaining said crucible at least 1095 degrees C. until the hardness of said release coating reaches about 95 Shore A.

2. A method for applying a release coating according to claim 1, said release coating selected from the group consisting of silicon nitride, silicon carbide, zirconium oxide, barium zirconate, and magnesium zirconate.

3. A method for applying a release coating according to claim 1, said defoamer selected from the group consisting of polypropylene glycol and polyethylene glycol.

4. A method for applying a release coating to a fused silica crucible used to form molten silicon into a solid ingot according to claim 1, comprising the further step:

repeating the step of spraying said wet release coating onto said crucible until said release coating is of the desired thickness.

5. A method for applying a release coating to a fused silica crucible used to form molten silicon into a solid ingot, comprising the steps:

using a release coating powder wherein 90% by volume of said powder has a particle size of less than 2 microns diameter, weighing out a unit portion of said release coating powder, measuring out a corresponding portion of a dry cellulose ether binder of not more than one fifth by weight of said unit portion of release coating powder, mixing said binder with said powder into a dry mixture, measuring a defined volume of water, measuring out a corresponding unit volume of a defoamer of between about 500 to 1000 parts per million by volume of said defined volume of water, mixing said defoamer with said water into a solvent mixture, mixing said dry mixture with said solvent mixture into a wet release coating, sieving said wet release coating so as to remove lumps and particles, confirming the viscosity of the wet release coating to be between 50 and 80 seconds as measured by a Zahn #2 cup, heating said crucible to be spray-coated to between 120 and 150 degrees F., spraying said wet release coating onto said crucible, slowly heating said crucible in oxidizing air to at least 1095 degrees C., and maintaining said crucible at least 1095 degrees C. until the hardness of said release coating reaches about 95 Shore A.

6. A method for applying a release coating according to claim 5, said release coating selected from the group consisting of silicon nitride, silicon carbide, zirconium oxide, barium zirconate, and magnesium zirconate.

7. A method for applying a release coating according to claim 5, said defoamer selected from the group consisting of polypropylene glycol and polyethylene glycol.

8. A method for applying a release coating to a fused silica crucible used to form molten silicon into a solid silicon ingot according to claim 5, comprising the further step:

repeating the step of spraying said wet release coating onto said crucible until said release coating is of the desired thickness.

9. A method for preparing a wet release coating for spray application to a fused-silica crucible used to contain molten silicon, comprising the steps:

using a release coating powder of which 90% by volume of said powder has a particle size of less than 2 microns diameter, weighing out a unit portion of said release coating powder, measuring out a corresponding portion of a dry cellulose ether binder of not more than one fifth by weight so said unit portion of release coating powder, mixing said binder with said powder into a dry mixture, measuring a defined volume of water, measuring out a corresponding unit volume of a defoamer of between about 500 to 1000 parts per million by volume of said defined volume of water, mixing said defoamer with said water into a solvent mixture, mixing said dry mixture with said solvent mixture into a wet release coating, sieving said wet release coating so as to remove lumps and particles, and confirming the viscosity of the wet release coating to be between 50 and 80 seconds as measured by a Zahn #2 cup.

10. A method for preparing a wet release coating according to claim 9, said release coating selected from the group consisting of silicon nitride, silicon carbide, zirconium oxide, barium zirconate, and magnesium zirconate.

11. A method for preparing a wet release coating according to claim 9, said defoamer selected from the group consisting of polpropylene glycol and polyethylene glycol.

* * * * *

UNITED STATES PATENT AND TRADEMARK OFFICE
CERTIFICATE OF CORRECTION

PATENT NO. : 6,491,971 B2
DATED : December 10, 2002
INVENTOR(S) : Michael A. Costantini et al.

It is certified that error appears in the above-identified patent and that said Letters Patent is hereby corrected as shown below:

Title page,
Item [57], ABSTRACT,
Line 3, delete "power", insert -- powder --

Column 4,
Line 7, delete "powered" insert -- powdered --
Line 33, delete second instance "firing"
Line 45, delete "we" insert -- us --

Column 5,
Line 40, delete "201"
Lines 62 and 65, delete "power" insert -- powder --

Column 6,
Lines 6 and 16, delete "power" insert -- powder --

Column 7,
Lines 21, 25, 26 and 33, delete "power" insert -- powder --
Line 21, delete "powered" insert -- powdered --

Column 8,
Lines 4 and 56, delete "power" insert -- powder --
Line 59, delete first instance "power" insert -- powder --
Line 59, delete second instance "power" insert -- powder --

Column 9,
Line 13, delete "power" insert -- powder --
Line 16, first instance delete "power" insert -- powder --
Line 16, delete second instance 'power" insert -- powder --

UNITED STATES PATENT AND TRADEMARK OFFICE
CERTIFICATE OF CORRECTION

PATENT NO. : 6,491,971 B2
DATED : December 10, 2002
INVENTOR(S) : Michael A. Costantini et al.

It is certified that error appears in the above-identified patent and that said Letters Patent is hereby corrected as shown below:

Column 10,
Line 60, delete "so" insert -- of --

Signed and Sealed this

Twenty-seventh Day of July, 2004

JON W. DUDAS
*Acting Director of the United States Patent and Trademark Office*